United States Patent
Zyuban et al.

(10) Patent No.: US 9,712,141 B2
(45) Date of Patent: Jul. 18, 2017

(54) MODULATION OF POWER SUPPLY VOLTAGE FOR VARYING PROPAGATION DELAY

(71) Applicant: Apple Inc., Cupertino, CA (US)

(72) Inventors: Victor Zyuban, Sunnyvale, CA (US); Norman J. Rohrer, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/958,783

(22) Filed: Dec. 3, 2015

(65) Prior Publication Data
US 2017/0163248 A1    Jun. 8, 2017

(51) Int. Cl.
| | | |
|---|---|---|
| *H03H 11/26* | (2006.01) | |
| *H03K 5/04* | (2006.01) | |
| *H03K 17/693* | (2006.01) | |
| *G05F 1/46* | (2006.01) | |

(52) U.S. Cl.
CPC .............. *H03K 5/04* (2013.01); *G05F 1/46* (2013.01); *H03K 17/693* (2013.01)

(58) Field of Classification Search
None
See application file for complete search history.

(56) References Cited

U.S. PATENT DOCUMENTS

| | | | |
|---|---|---|---|
| 5,916,237 A | 6/1999 | Schu | |
| 8,020,018 B2 | 9/2011 | Hober et al. | |
| 8,618,857 B2 | 12/2013 | Dong et al. | |
| 8,629,694 B1* | 1/2014 | Wang | G04F 10/005 327/24 |
| 2007/0176659 A1* | 8/2007 | Gomm | H03K 5/1565 327/175 |
| 2010/0052800 A1* | 3/2010 | Buonpane | H03K 5/135 331/57 |
| 2010/0085823 A1* | 4/2010 | Carpenter | G11C 7/22 365/194 |
| 2013/0285724 A1* | 10/2013 | Staszewski | H03L 7/0996 327/159 |
| 2013/0293281 A1* | 11/2013 | Baumann | G06F 1/305 327/419 |
| 2014/0266369 A1* | 9/2014 | Brunolli | H03K 3/0375 327/211 |
| 2015/0241890 A1* | 8/2015 | Raychowdhury | G05F 1/56 713/300 |

* cited by examiner

*Primary Examiner* — Lincoln Donovan
*Assistant Examiner* — Khareem E Almo
(74) *Attorney, Agent, or Firm* — Fenwick & West LLP

(57) ABSTRACT

Embodiments relate to modulating a power supply voltage for varying a propagation delay of data paths within an integrated circuit. The power supply voltage is modulated to increase the delay of shorter data paths for reducing an incidence of hold time violations without substantially affecting the delay of longer data paths. For example, the power supply voltage is reduced from a nominal value in the first half clock cycle to increase delay of both the shorter data paths and the longer data paths. The power supply voltage is increased from the nominal value in the second half clock cycle to decrease delay of the longer data paths within the second half clock cycle such that the overall delay of the longer data paths is virtually same as when the power supply voltage is fixed at the nominal value for the entire clock cycle.

20 Claims, 10 Drawing Sheets

MODULATION OF POWER SUPPLY VOLTAGE FOR VARYING PROPAGATION DELAY

BACKGROUND

1. Field of Technology

Embodiments generally relate to varying the propagation delay in a circuit by modulating a power supply voltage of the circuit.

2. Background

A typical system on a chip (SOC) includes various logic blocks, any of which may also include a pipeline of timing elements such as latches and flip-flops. A pipeline of timing elements is typically connected in series, where the data output of one timing element is connected to the data input of a subsequent timing element. In a pipeline of timing elements, a hold time violation occurs when the data input of a pipeline timing element switches in the current clock cycle before the end of a hold time required to reliably store the data from the previous clock cycle. Hold time violations limit the maximum operating clock frequency of the SOC. Hold time violations may cause chip failures at low frequencies as well as high frequencies. Unlike cycle time or setup time violations, hold time violations typically cannot be fixed by lowering the frequency or raising the operating voltage.

Hold time violations are generally occur when multiple data paths are used between timing elements, some data paths including fewer logic elements between the timing elements (e.g., shorter data paths) than other data paths (e.g., longer data path). Conventionally, hold time violations are resolved by inserting delay elements in the shorter data paths to increase the propagation delay of such shorter data paths to avoid premature switching of the data input before the clock signal. However, the added delay elements take up additional die area and increase power consumption of a circuit.

SUMMARY

Embodiments of the present disclosure relate to modulation of a power supply voltage for varying a propagation delay of data paths between a pipeline of timing elements within an integrated circuit. The power supply voltage may be modulated to increase the propagation delay of shorter data paths and thereby prevent hold time violations from occurring without substantially affecting the propagation delay of longer data paths.

In one embodiment, the power supply voltage is decreased to a first range of values lower than a nominal value in the first half period of a clock cycle to increase a propagation delay of both the shorter data paths and also the longer data paths during the first half period. The power supply voltage is increased in the second half period of the clock cycle to a second range of values higher than its nominal value to decrease a propagation delay of the longer data path during the second half period such that the overall propagation delay of the longer data path is substantially similar to when the power supply voltage is unchanged at its nominal value for the entire clock period. The propagation delay of shorter data paths increases during the first half period and an incidence of hold time violations is reduced. In some embodiments, the power supply voltage is modulated to increase the propagation delay of the shorter data paths to avoid hold time violations.

In one embodiment, the power supply voltage is modulated by a control circuit that includes a multiplexer. The multiplexer may be a two-input multiplexer with a first input connected to a first voltage source of a first voltage level and the second input connected to a second voltage source of a second voltage level lower than the first voltage level. configuring a multiplexer to couple the first supply voltage rail to a first input or a second input of the multiplexer responsive to a voltage level of the clock signal where the multiplexer couples a rail of the power supply voltage to the first input or the second input of the multiplexer in response to a voltage level of the clock signal. For example, the multiplexer couples the power supply voltage rail to the first input when the clock signal is at a logical high level (e.g., close to the supply voltage of the circuit) and couples the power supply voltage rail to the second input when the clock signal is at a logical low level (i.e., close to a ground voltage level of the circuit). In one embodiment, the multiplexer may include two P-type Metal Oxide Semiconductor Field Effect Transistors (PMOSFETs) with their gate terminals coupled to inverted versions of the clock signal, the drain terminals coupled to one of the two power supply voltage rails, and a source terminal of one PMOSFET coupled to a voltage source of the first voltage level and that of the other PMOSFET coupled to a voltage source of the second voltage level lower than the first level. One of the two power supply voltage rails powering the circuits is often referred to as ground rail.

In one embodiment, the control circuit includes a low-dropout regulator (LDO) that includes an input terminal coupled to the second voltage source and an output terminal coupled to at least one of the two supply voltage rails, where the LDO provides an output voltage at the output terminal that is same as the second voltage level.

In one embodiment, the power supply voltage is modulated by a control circuit that includes an oscillating circuit that oscillates at a frequency equal to a frequency of the clock signal. The oscillating circuit is coupled between the two power supply voltage rails and includes an inductor, a capacitor, and two switches to inject energy for sustaining its oscillations. The resonant frequency of the oscillator must be designed to be close to the frequency of the clock. Then, the oscillation frequency of the power supply voltage matches the frequency of the clock. In order to minimize the energy required to sustain the oscillations, the resonant frequency must be adjusted to track the clock frequency. The resonant frequency may be varied by adjusting inductance of the inductor. One of the two switches is coupled between the inductor and a power supply voltage rail and is turned on with a short pulse to inject energy into the oscillating circuit during every oscillation cycle. The short pulse may either be a pull-down pulse or a pull-up pulse, where the pull-down pulse is used when the switch is an N-type Metal Oxide Semiconductor Field Effect Transistor (NMOSFET) and the pull-up pulse is used when the switch is a PMOSFET.

In one embodiment, each of the pull-down pulse and the pull-up pulse is generated using a NAND digital logic gate having a first input terminal and a second input terminal, where first input terminal is coupled to receive the clock signal and the second input terminal is coupled to receive a delayed version of the clock signal. A pulse width of each of the pull-down pulse and the pull-up pulse is equal to a time delay between the clock signal and the delayed clock signal. The pull-down pulse and the pull-up pulse are generated using opposite edges of the clock signal. In one embodiment, the power supply voltage modulation may be varied across different power domains of the integrated circuit.

Embodiments also relate to a non-transitory computer-readable medium storing a digital representation of an example control circuit, that modulates the power supply voltage levels for one or more power domains of an integrated circuit. The non-transitory computer-readable medium may also store instructions for modulating the power supply voltage to minimize incidence of hold time violations.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

Figure 1:
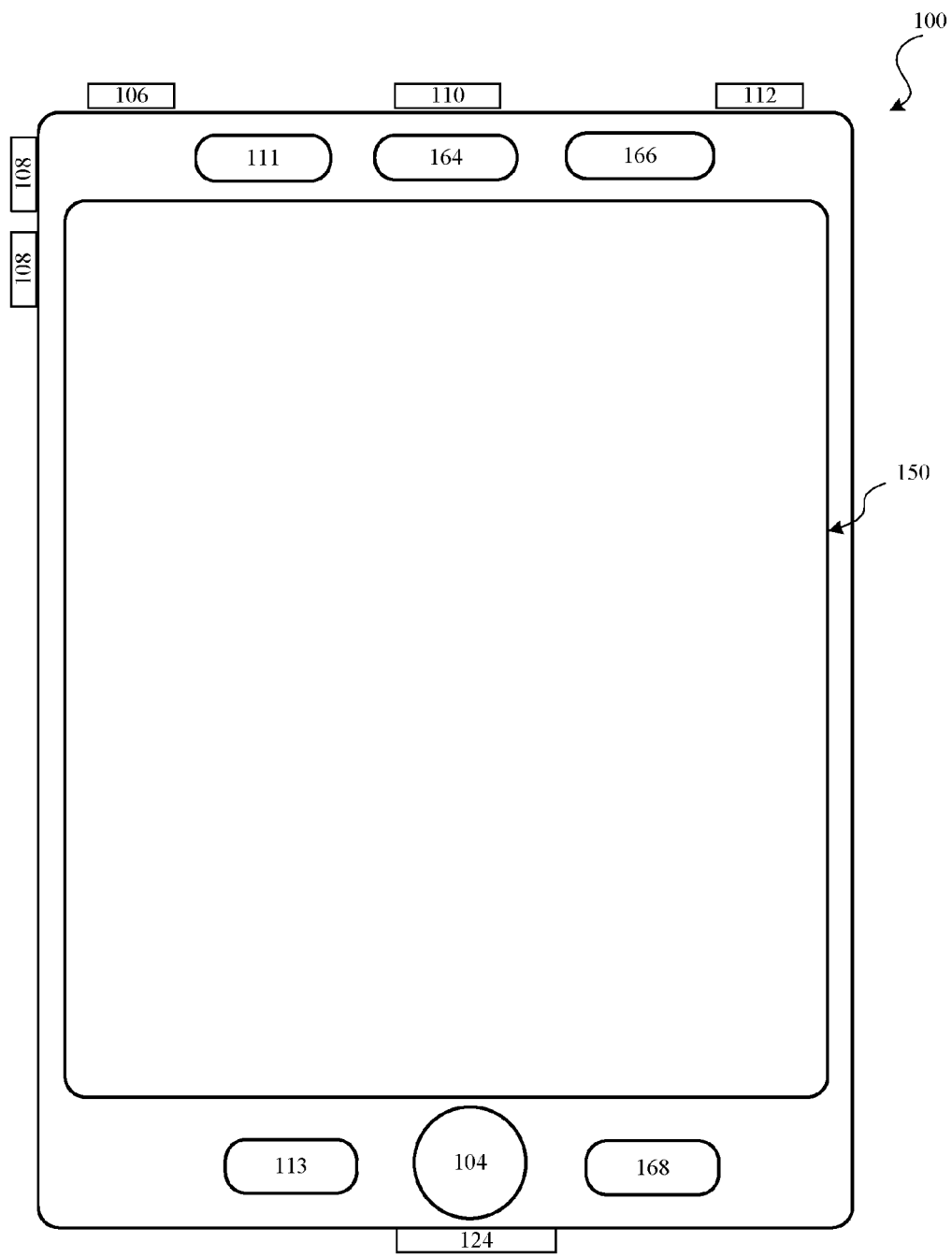
FIG. 1 is a high-level block diagram of a portable electronic device, according to one embodiment.

The figures depict, and the detail description describes, various non-limiting embodiments for purposes of illustration only. One skilled in the art will readily recognize from the following discussion that alternative embodiments of the structures and methods illustrated herein may be employed without departing from the principles described herein.

DETAILED DESCRIPTION

Embodiments of the present disclosure relate to modulating a power supply voltage of a circuit to control propagation delay of signals along data paths between timing elements in the circuit. The power supply voltage may be modulated to increase the propagation delay of shorter data paths without or with reduced impact on the propagation delay of longer data paths. A voltage difference between supply voltage rails is reduced below a nominal value during part of a clock cycle to increase propagation delay of the shorter data paths and longer data paths, but increased above the nominal value in another part of the clock cycle to decrease propagation delay of the longer data paths. In this way, hold time violations can be prevented without or with minimal impact on propagation delay along the longer data paths.

The term "timing element" or "timing element circuit" described herein refers to a circuit that operates in response to a clock signal. Example timing element or timing element circuit include, but is not limited to, latch, flip-flop, edge triggered flip-flop, and master-slave latch.

The term "propagation delay" described herein refers to an amount of time it takes a signal to propagate from one end of a signal path to another end of the signal path. For example, when a signal propagates a signal path that begins from a launching timing element and ends at a capturing timing element, a propagation delay of the signal (or of the signal path) is an amount of time the signal takes to traverse from the launching timing element to the capturing timing elements including any other circuits in between the two timing elements.

The term "nominal power supply voltage" or "nominal VDD" or "VDD_NOM" described herein refers to a typical power supply voltage level used for a circuit when the circuit is manufactured using a silicon fabrication process. For example, the nominal power supply voltage for a 28 nm silicon fabrication process is about IV.

Exemplary Device

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are only used to distinguish one element from another. For example, a first timing element could be termed a second timing element, and, similarly, a second timing element could be termed a first timing element, without departing from the scope of the various described embodiments. The first timing element and the second timing elements are both timing elements, but they are not the same timing element.

The terminology used in the description of the various described embodiments herein is for the purpose of describing particular embodiments only and is not intended to be limiting. As used in the description of the various described embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Embodiments of electronic devices, user interfaces for such devices, and associated processes for using such devices are described. In some embodiments, the device is a portable communications device, such as a mobile telephone, that also contains other functions, such as PDA and/or music player functions. Exemplary embodiments of portable multifunction devices include, without limitation, the iPhone®, iPod Touch®, Apple Watch®, and iPad® devices from Apple Inc. of Cupertino, Calif. Other portable electronic devices, such as wearables, laptops or tablet computers, are, optionally, used. It should also be understood that, in some embodiments, the device is not a portable communications device, but is a desktop computer. It should further be noted that, in some embodiments, the disclosed electronic device may include a touch sensitive surface (e.g., a touch screen display and/or a touch pad). An example electronic device described below in conjunction with FIG. 1 (e.g., device 100) may include a touch-sensitive surface for receiving user input. The electronic device may also include one or more other physical user-interface devices, such as a physical keyboard, a mouse and/or a joystick.

FIG. 1 is a high-level block diagram of a portable electronic device 100 in accordance with some embodiments. The device 100 optionally also includes one or more physical buttons, such as a "home" or menu button 104. The menu button 104 is, optionally, used to navigate to any application in a set of applications that are, optionally executed on the device 100. In some embodiments, the menu button 104 includes a fingerprint sensor that identifies a fingerprint on the menu button 104. The fingerprint sensor optionally is used to determine whether a finger on the menu button 104 has a fingerprint that matches a fingerprint used to unlock the device 100. Alternatively, in some embodiments, the menu button 104 is implemented as a soft key in a GUI displayed on a touch screen.

In some embodiments, the device 100 includes a touch screen 150, the menu button 104, a push button 106 for powering the device on/off and locking the device, volume adjustment button(s) 108, a Subscriber Identity Module (SIM) card slot 110, a head set jack 112, and a docking/charging external port 124. The push button 106 is, optionally, used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, the device 100 also accepts verbal input for activation or deactivation of some functions through a microphone 113. The device 100 includes various components including but not limited to a memory (which optionally includes one or more computer readable storage mediums), a memory controller, one or more processing units (CPU's), a peripherals interface, an RF circuitry, an audio circuitry, a speaker 111, a microphone 113, an input/output (I/O) subsystem, and other input or control devices. The device 100 optionally includes one or more optical sensors 164, one or more proximity sensors 166, and one or more accelerometers 168. The device 100 may include components not shown in FIG. 1.

The device 100 is only one example of a portable electronic device, and that the device 100 optionally has more or fewer components than listed above, optionally combines two or more components, or optionally has a different configuration or arrangement of the components. The various components of the device 100 listed above are implemented in hardware, software, or a combination of both hardware and software, including one or more signal processing and/or application specific integrated circuits (ASICs). An example ASIC such as an SOC is described below in conjunction with FIG. 2.

Example System on a Chip

Figure 2:
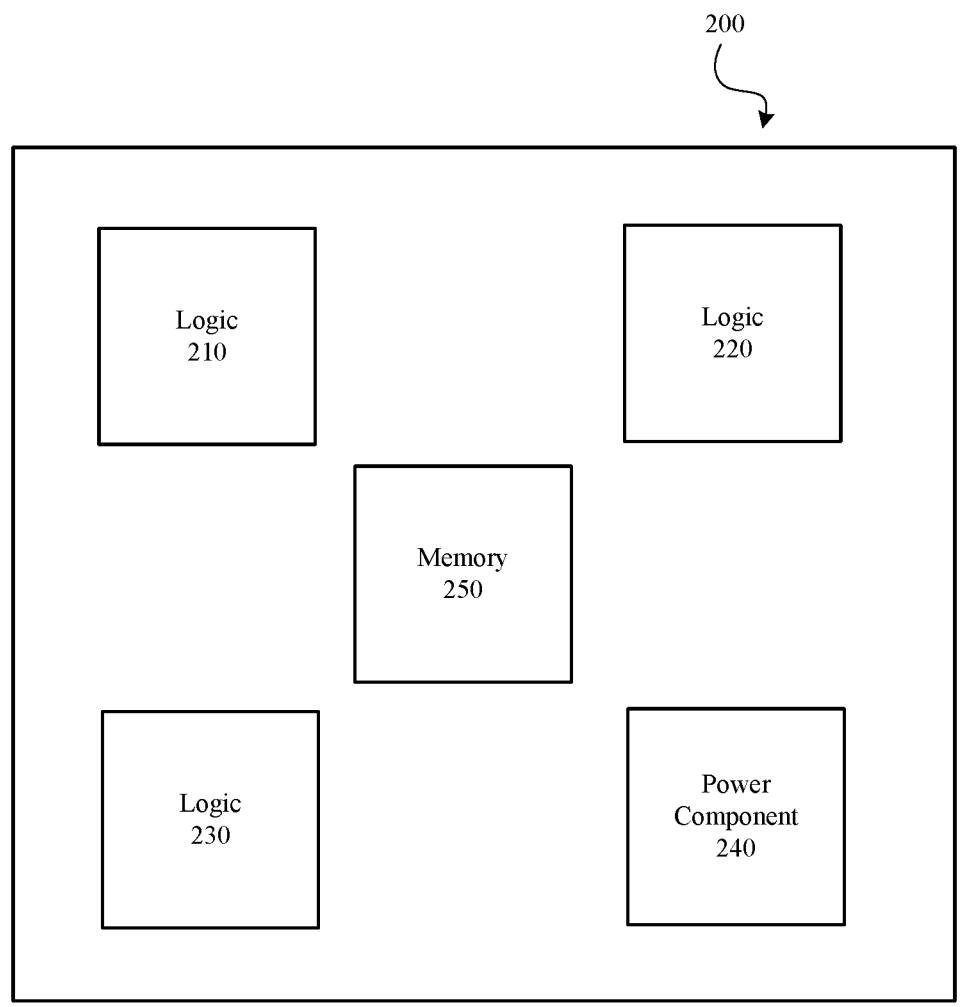
FIG. 2 is a high-level block diagram of a system on a chip (SOC), according to one embodiment.

FIG. 2 is a high-level block diagram of an SOC 200, according to one embodiment. The SOC 200 is an integrated circuit (IC) that integrates all components of a computer or other electronic system into a single chip. The SOC 200 may include digital, analog, mixed-signal, and radio-frequency (RF) functions on a single chip substrate. SOCs are common in the portable electronics market due to their low power consumption. The SOC 200 may include, among other components, one or more logic components (e.g., logic 210, logic 220, and logic 230), one or more memory components (e. g., memory 250), and one or more power components (e.g., power component 240). While FIG. 2 illustrates an SOC, this disclosure is equally applicable to other types of ASICs that may or may not include various components integrated onto a single chip.

Logic components of the SOC 200 may include one or more of microprocessors, digital signal processor (DSP), image signal processor (ISP), graphics processing unit (GPU), microcontroller, and any other processing units. For example, logic 210 is one or more processors or processing cores of a processing complex, logic 220 is a GPU, and logic 230 is an ISP. While FIG. 2 shows three logic components, it is understood that the SOC 200 may include more than or less than three logic components.

The power component 240 provides power supply voltage to various components of the SOC 200. The power component 240 typically includes multiple power domains with each power domain having a unique power supply voltage that is not shared with other power domains. For example, each logic component of the SOC 200 may be associated with its own unique power domain and hence its own unique power supply voltage. Alternatively or additionally, components within a logic component of the SOC 200 (e.g., memory and CPU within logic 210) may be associated with their own separate and unique power domains. In some embodiments, power component 240 may correspond to one or more voltage regulators for each power domain. Although power component 240 is shown in FIG. 2 as being integrated on SOC 200, in some embodiments power component 240 may be external from SOC 200.

The memory 250 may include random access memory (RAM) and non-volatile memory such as magnetic disk storage devices and flash memory devices.

Propagation Delay and Hold Time Violation

Figure 3:
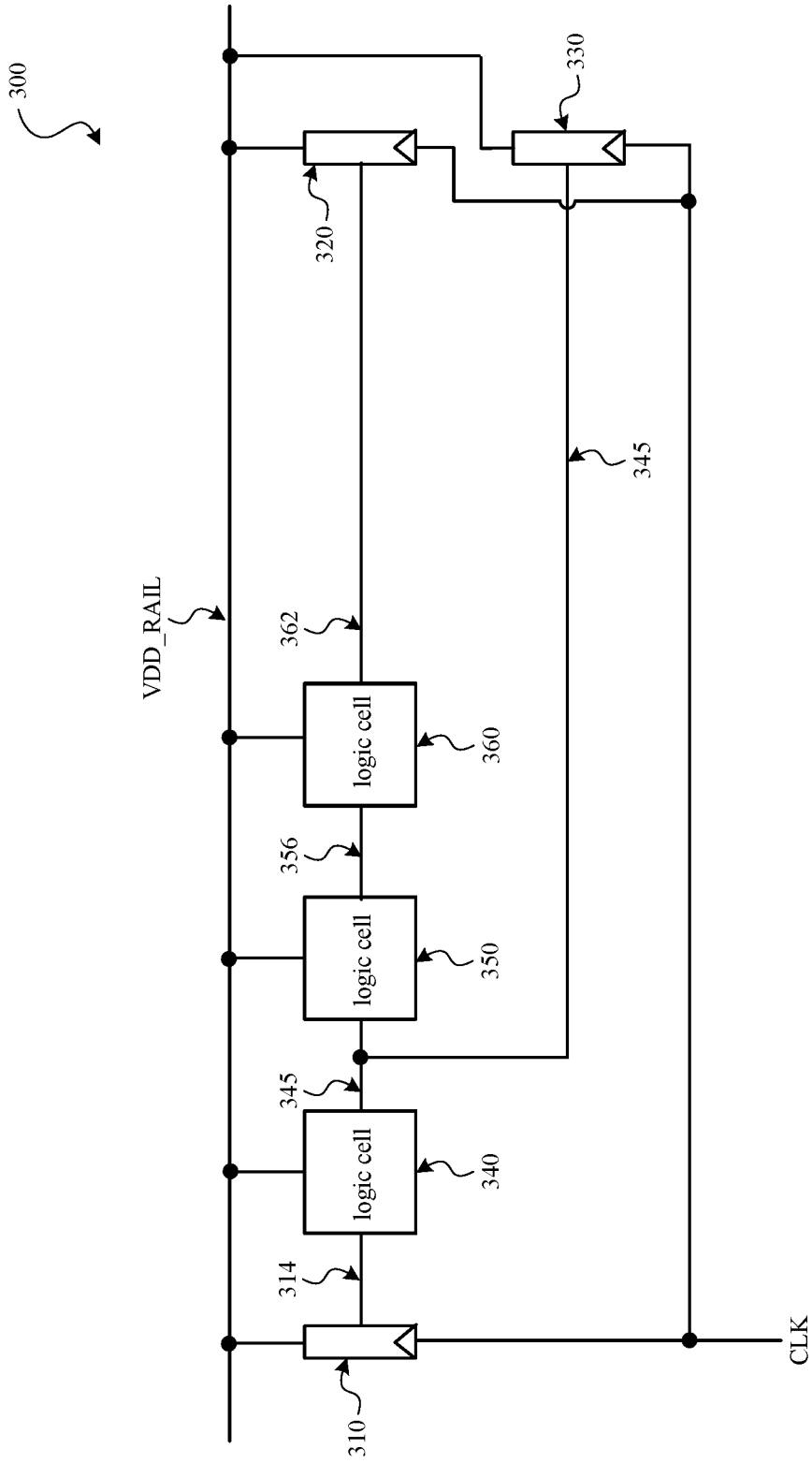
FIG. 3 is a block diagram of a circuit including pipeline timing elements with a possible hold time violation, according to one embodiment.

FIG. 3 is a block diagram of a circuit 300 in an SOC that includes pipeline timing elements with a possible hold time violation, according to one embodiment. The circuit 300 includes flip-flops 310, 320, and 330 as pipeline timing elements such that a data output of the flip-flop 310 is coupled to data inputs of the flip-flops 320 and 330. The circuit 300 also includes combinational logic cells 340, 350, and 360 along a data path between the flip-flops 310 and 320, and the combinational logic cell 340 along a data path between the flip-flops 310 and 330. Each of the flip-flops 310, 320, and 330 receives a clock signal, and in some embodiments, all or part of the flip-flops share the same clock signal (e.g., CLK). In embodiments where the flip-flops share the same clock signal, the edges of the clock signal that trigger the flip-flops may not be aligned due to different propagation delays of different paths travelled by each clock signal before reaching the flip-flops.

A power supply rail VDD_RAIL provides supply voltage to the flip-flops and logic cells. The power supply voltage is between two power supply rails, VDD_RAIL and another corresponding to a low reference voltage such as ground, which is not shown in FIG. 3 and all subsequent figures for simplicity.

Timing elements have setup time and hold time requirements to ensure reliable sampling of data and to avoid metastability. Setup time described herein refers to an amount of time the data signal should be held steady before the triggering clock event occurs (e.g., a clock edge) so that the data is reliably sampled by the clock signal. Hold time described herein refers to an amount of time the data signal should be held steady after the triggering clock event (e.g., the clock edge) so that the data is reliably sampled. A hold time violation occurs when a data input arriving at a timing element (from the timing element that is immediately before in its signal path) changes a value at the data input from the previous clock cycle before the end of the hold time interval corresponding to a clock transition at the timing element for the current clock cycle.

FIG. 3 shows two data paths: a first data path between the flip-flops 310 and 330, and a second data path between the flip-flops 310 and 320. The flip-flop 310 is referred to as a launching timing element because a data path for a signal traversing between the flip-flop 310 and the subsequent flip-flop begins with a clock edge triggering the flip-flop 310. Conversely, the flip-flops 320 and 330 are referred to as capturing flip-flops as they capture their respective data inputs from the data output of the flip-flop 310 from the previous clock cycle (after passing through some combinatorial logic). The first data path is a shorter data path or a faster data path while the second data path is a longer data path or slower data path because a data signal traversing through the second signal path passes through more logic cells 340, 350, and 360, whereas a data signal traversing through the first data path passes through only the logic cell 340 before reaching the flip-flop 330. As discussed herein, a shorter data path is a data path with a propagation delay that is smaller than the time interval defined as a sum of the hold time and the difference between the arrival times of the clock at the inputs of the two flops launching (e.g., flip-flop 310) and receiving the data (e.g., flip-flop 330). The shorter data paths are responsible for causing hold time violations. A longer data path is a data path with a propagation delay that is longer relative to that of the shorter data paths. In some embodiments, the propagation delay of the longer data paths is virtually the same as the time period of the clock signal of the circuit. The propagating delay of the longer path sets the upper limit on the operating frequency of the circuit.

If the data output 314 of the flip-flop 310 reaches the data input 345 at the flip-flop 330 before the expiration of the hold window of the flip-flop 330, a hold time violation may occur. In such a scenario, switching of the existing data value from the previous clock cycle at the data input 345 (i.e., data value switches from a logical high level to a logical low level or vice versa) may result in a hold time violation because the data from the previous clock cycle is overwritten before the data is reliably captured. In other cases, hold time violations may manifest itself as the transition time of the signal at the output of the timing element receiving the data (e.g., flip-flop 330) increases, which may lead to setup time violations down the pipeline. Sometimes the hold time violations may result in the flop entering a meta-stable state, when the signal at the output of the flop is between the logic high and low levels and is therefore undefined. The signal at the output of the flop in the metastable state may be interpreted differently by logic elements receiving the data from the flop, leading to a logic error of the circuit. One way of preventing the hold time violation is by adding delay elements along the shorter data path to increase the shorter data path propagation delay. However, such solutions take up significant additional die area and results in significant power dissipation.

Modulation of Power Supply Voltage to Prevent Hold Time Violations

Figure 4:
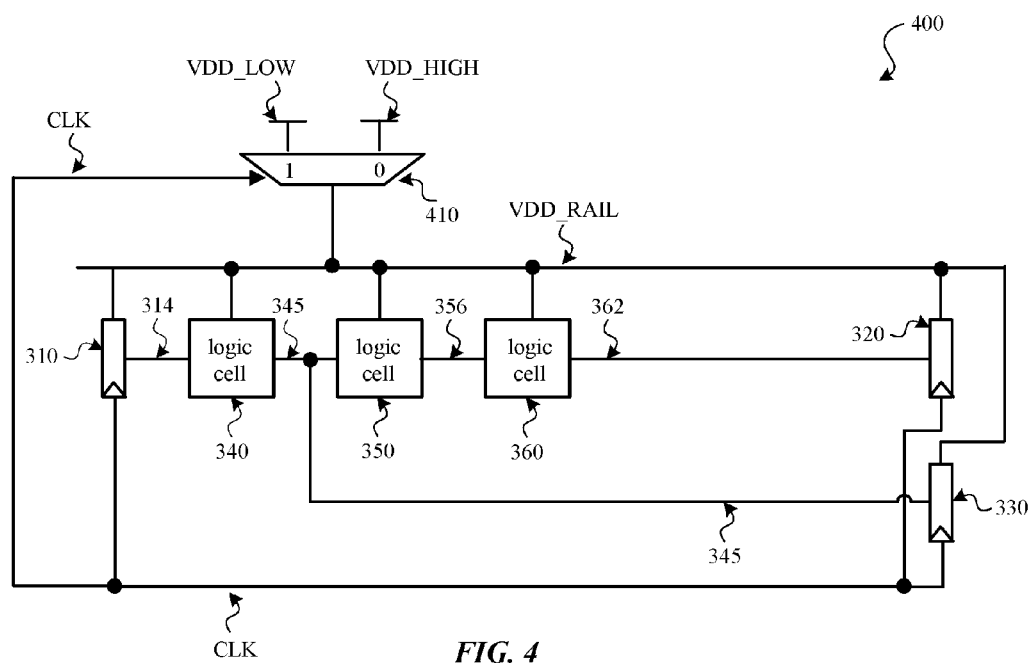
FIG. 4 is a block diagram of a circuit including a power supply multiplexer for modulating the power supply voltage, according to one embodiment.

FIG. 4 is a block diagram of circuit 400 including a power supply multiplexer for modulating the power supply voltage, according to one embodiment. The circuit 400 includes a power supply multiplexer 410 in addition to components as shown in FIG. 3. The power supply multiplexer provides power supply voltage alternating between VDD_LOW and VDD_HIGH to the power supply voltage rail VDD_RAIL. For this purpose, the power supply multiplexer 410 has two inputs connected to two voltage sources, one at voltage level VDD_HIGH and the other at voltage level VDD_LOW. The power supply multiplexer 410 may selectively connect its output to one of the inputs based on clock signal CLK.

The propagation delay of a circuit (including timing elements and combinatorial logic elements) increases as the power supply voltage difference (VDD–VSS) decreases, and vice versa. Using this principle, the power supply multiplexer 410 modulates the voltage at its output (and hence the voltage at VDD_RAIL) to vary propagation delay of data paths between the timing elements of the circuit 400. One of such applications is reducing or prevention of hold time violations caused by signals traversing through a shorter data path without substantially affecting the propagation delay of the longer data path.

For example, high power supply voltage rail VDD_RAIL (with a nominal value VDD_NOM, shown in FIG. 5) is set to a voltage lower than VDD_NOM in the first half period of the clock cycle and is then set to a voltage higher than VDD_NOM in the second half period of the clock cycle, while the low power supply voltage rail such as ground or VSS is maintained at a constant voltage for the entire period of the clock cycle. As discussed above in conjunction with FIG. 3, signal propagation within the shorter data path (i.e., from the flip-flop 310 to the flip-flop 330 through the logic cell 340) typically occurs within the first half period of the clock cycle and sometimes entirely within the first quarter period of the clock cycle. The propagation delay of the shorter data path increases when compared to a propagation delay corresponding to VDD_NOM. But the shorter data path's propagation delay is not affected in the second half period because the entire signal propagation of the shorter data path is completed within the first half period of the clock cycle and such signal propagation does not occur during the second half period.

In a longer data path, on the other hand, the signal propagation takes up almost the entire period of the clock cycle (and in some cases the longer data path actually sets the clock frequency and takes up the entire clock period). Hence, the propagation delay of the longer data path increases in the first half period and decreases in the second half period of the clock cycle relative to a propagation delay that occurs when the voltage at the high supply voltage supply rail is set to VDD_NOM for the respective half period. By choosing the power supply voltage increase in the first half period to be the same as the power supply voltage decrease in the second half period, the overall propagation delay of the longer data path for the entire period remains virtually unchanged from the nominal propagation delay that occurs when the power supply voltage remain constant at VDD_NOM across the clock cycle. If the duty cycle of the clock is different from 50%, then the magnitude of the voltage increase in the first half period would be different from the magnitude of the voltage decrease in the second half period, so that the sum of the voltage deltas (one positive and another negative), multiplied by the corresponding lengths of the half periods equals zero or nearly equals zero.

In one embodiment, a duty cycle of the clock signal affects how similar a propagation delay of the longer data path is when the power supply voltage remains constant at VDD_NOM versus when the power supply voltage is modulated. When the clock duty cycle is at about 50%, the amount of increase in propagation delay of the longer data path in the first half period is substantially the same as the amount of decrease in propagation delay of the longer data path in the second half period. If, on the other hand, the clock duty cycle deviates significantly from 50% (e.g., 20% or 75%), then the amount of increase in the propagation delay in the first half period differs significantly from the amount of decrease in the second half period. Such difference results may be undesirable because the overall propagation delay of the longer data path over one clock cycle is substantially different from the propagation delay when power supply voltage remains constant (i.e., VDD set to VDD_NOM). If the duty cycle of the clock is different from 50%, then the magnitude of the voltage increase in the first half period would be different from the magnitude of the voltage decrease in the second half period, so that the sum of the voltage deltas (one positive and another negative), multiplied by the corresponding lengths of the half periods equals zero or nearly equals zero. For example, if the length of the first half period is 25% of the cycle, and the length of the second half period is 75% of the cycle, then the magnitude of the voltage decrease during the first half cycle may be set to 60 mV, and the magnitude of the voltage increase during the second half cycle may be set to 20 mV. In this case the weighted sum is computed as 25%*(−60 mV)+75%*20 mV=0.

The power supply multiplexer 410 selects one of its two inputs based on the control signal CLK. The output of the power supply multiplexer 410 switches between its two inputs as CLK transitions between a logical high level and a logical low level. In one embodiment, when CLK is at a logical high level, the power supply multiplexer 410 outputs VDD_LOW (which is lower than VDD_NOM) to the power supply voltage rail VDD_RAIL. Conversely, when CLK is at a logical low level, the power supply multiplexer 410 outputs VDD_HIGH (which is higher than VDD_NOM) to VDD_RAIL. The difference or delta between VDD_NOM and VDD_LOW (and/or VDD_HIGH) representing an amount of power supply voltage modulation is set based on the value of VDD_NOM. For example, if VDD_NOM is 1.0V, the delta is set to 100 mV, and if VDD_NOM is 0.5V, the delta is set to 50 mV. The higher the power supply voltage the larger the magnitude of the voltage modulation required to achieve the desired slow-down of the faster path to avoid the hold violation errors.

In one embodiment, the high power supply voltage is reduced in the half cycle period beginning with the rising edge and ending with the falling edge of clock signal CLK, and it is increased in the other half cycle period of clock signal CLK. For this embodiment, a logical high level of clock signal CLK corresponds to VDD_LOW and a logical low level of clock signal CLK corresponds to VDD_HIGH. Alternatively, the high power supply voltage value is reduced in the half cycle period beginning with the falling edge and ending with the rising edge of clock signal CLK, and it is increased in the other half cycle period of clock signal CLK. For this alternative embodiment, a logical low level of clock signal CLK corresponds to VDD_LOW and a logical high level of clock signal CLK corresponds to VDD_HIGH. A timing operation of the power supply multiplexer 410 is described below in conjunction with FIG. 5.

Figure 5:
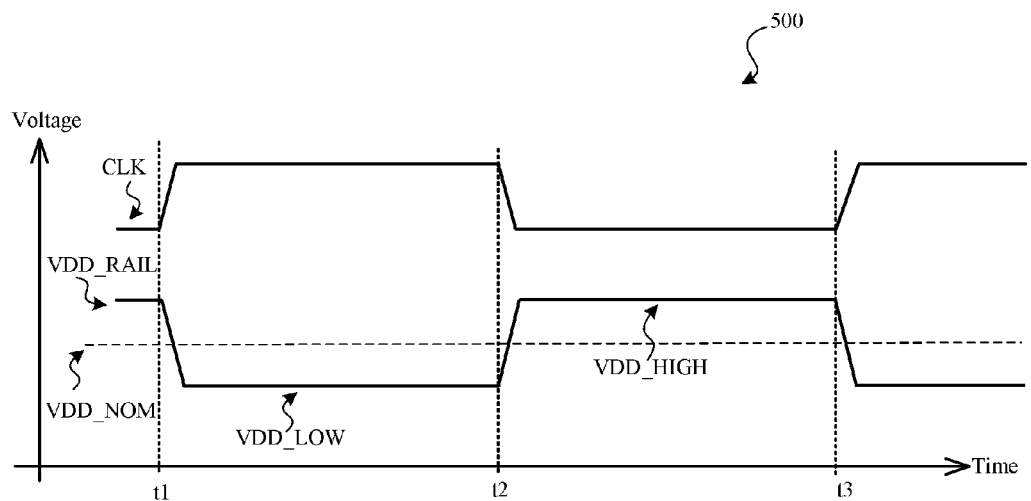
FIG. 5 is a timing diagram illustrating an operation of the power supply multiplexer of FIG. 4, according to one embodiment.

FIG. 5 is a timing diagram illustrating an operation of the power supply multiplexer of FIG. 4, according to one embodiment. In FIG. 5, x-axis represents time and y-axis represents voltage of various signals. Time axis includes various points in time, t1 through t3, represented by vertical dotted lines. FIG. 5 shows clock signal CLK and voltage at the power supply voltage rail VDD_RAIL along with a nominal value of the power supply voltage VDD_NOM. The time period between points t1 and t3 constitutes one period of clock signal CLK.

At point t1, the clock signal CLK transitions from a logical low level to a logical high level, and power supply multiplexer 410 selects VDD_LOW such that the power supply voltage rail VDD_RAIL is set to VDD_LOW after a short time interval from t1. As illustrated in FIG. 5, VDD_LOW is lower than the nominal power supply voltage VDD_NOM. While VDD_LOW is shown as a voltage signal at a voltage level, VDD_LOW can have a range of voltage levels around the voltage level. For example, the voltage waveform on VDD_RAIL may be a sinusoidal waveform with a range of voltage levels around its trough (e.g., a half period where the voltage level is lower than an average voltage level of the sinusoidal waveform) corresponding to VDD_LOW. Point t2 represents a transition of clock signal CLK from a logical high level to a logical low level, and also signifies the end of the first half period of clock signal CLK and the beginning of the second half period. With a falling edge of clock signal CLK, the power supply multiplexer 410 selects VDD_HIGH such that VDD_RAIL is set to VDD_HIGH after a short time interval from t2. As illustrated in FIG. 5, VDD_HIGH is higher than VDD_NOM. While VDD_HIGH is shown as a voltage signal at a voltage level, VDD_HIGH can have a range of voltage levels around the voltage level similar to a voltage range corresponding to VDD_LOW. For example, the voltage waveform on VDD_RAIL may be a sinusoidal waveform with a range of voltage levels around its crest (e.g., a half period where the voltage level is higher than the average voltage level of the sinusoidal waveform) corresponding to VDD_HIGH. Point t3 represents the end of the second half period of clock signal CLK and also the end of one time period of clock signal CLK. At point t3, the rising edge of clock signal CLK begins a new time period and the power supply multiplexer 410 selects VDD_LOW as discussed above, and repeats the above process of selecting either VDD_LOW or VDD_HIGH based on the state of clock signal CLK for future time periods. An example implementation of the power supply multiplexer 410 using transistors is described below in conjunction with FIG. 6.

Figure 6:
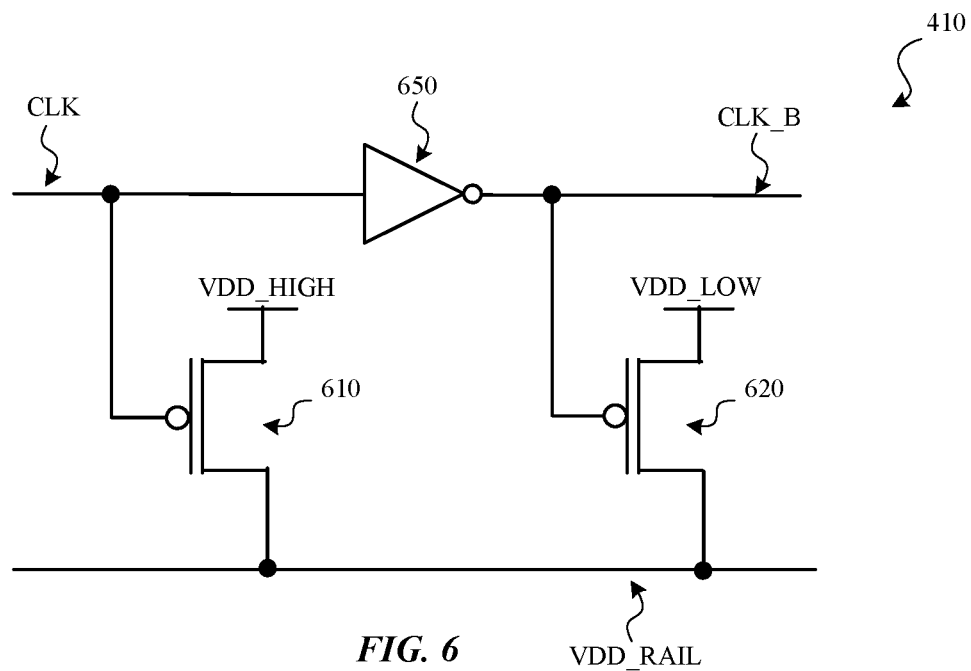
FIG. 6 is a block diagram of components of the power supply multiplexer of FIG. 4, according to one embodiment.

FIG. 6 is a block diagram of the power supply multiplexer 410 of FIG. 4, according to one embodiment. The block diagram shows an example implementation of the power supply multiplexer 410 using P-type Metal Oxide Semiconductor Field Effect Transistors (PMOSFETs) 610 and 62. The source terminals of the PMOSFETs are coupled to the voltage sources VDD_HIGH or VDD_LOW, and the drain terminals are coupled to the power supply voltage rail VDD_RAIL of the power distribution network. The gate terminals of the PMOSFETs are coupled to the clock signals, clock signal CLK or inverted clock signal CLK_B, where CLK_B is 180 degrees out of phase relative to clock signal CLK. For example, clock signal CLK is the input signal to the inverter 650 and clock signal CLK_B is its output signal. The clock signals that control the PMOSFETs may be tapped from the clock distribution tree of the SOC. The phase alignment between the signal controlling the power switches and the clock signal at the clock pins of the timing elements is achieved by controlling the propagation delay of the signal from the source of the clock distribution tree to the flops and from the source of the clock distribution tree to the control input of the power switch multiplexer. In one of the embodiments, the phases of the two clock signals are aligned is such a way that the signal at the control input of the power switch multiplexer arrives before the other clock signal that arrives at the clock pins of the timing elements. Many instances of the power supply multiplexer 410 are distributed over the power distribution network of the SOC to enable that each PMOSFET has enough drive strength to supply the current needed for the operation of the circuits powered by the corresponding power supply voltage rail. One or both of the input power supply voltage values of VDD_LOW and VDD_HIGH may be generated either on-chip or off-chip. In one embodiment, VDD_HIGH is generated off-chip and VDD_LOW is generated on-chip using a low-dropout regulator (LDO) as described below with reference to FIG. 7.

Figure 7:
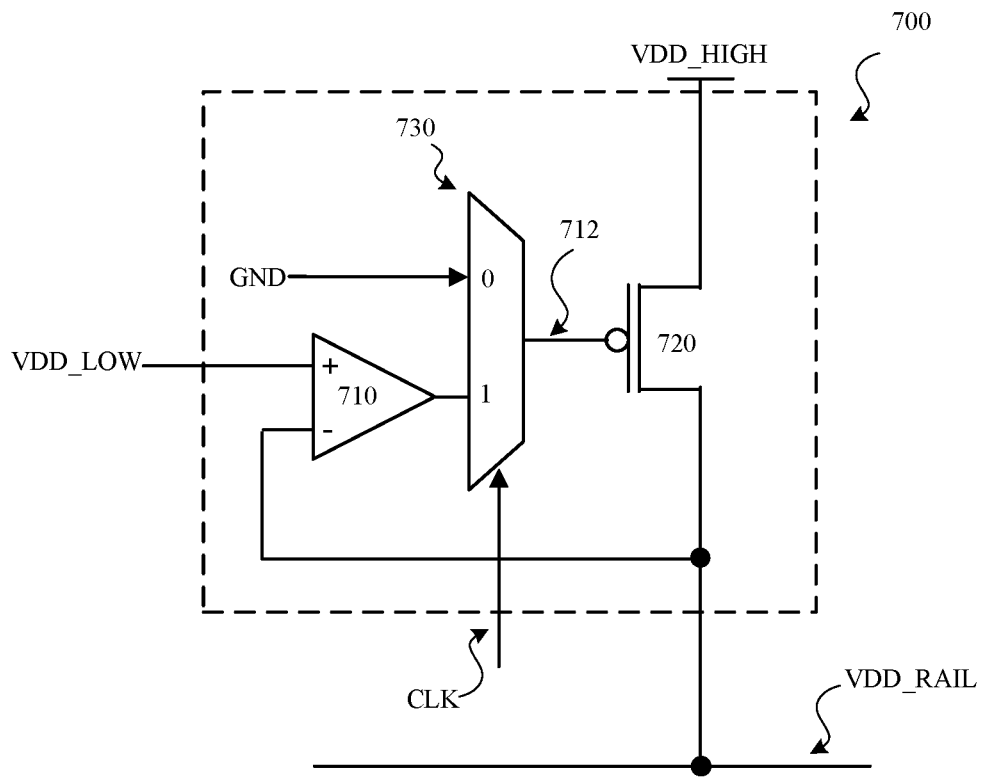
FIG. 7 is a block diagram a low-dropout regulator (LDO) for generating a power supply voltage, according to one embodiment.

FIG. 7 is a block diagram for generating a power supply voltage using an LDO 700, according to one embodiment. The LDO 700 has two operating modes, an active mode and a bypass mode. The LDO control loop may set the voltage for the power supply rail VDD_RAIL to either VDD_LOW or VDD_HIGH based on whether the LDO control loop is activated or bypassed. The LDO control loop is controlled by a multiplexer 730, which has the same operation as that of power supply multiplexer 410 described above in conjunction with FIG. 4 but with inputs that are different from that of power supply multiplexer 410. The inputs of the multiplexer 730 are connected to ground or low supply voltage (GND) (selected when clock signal CLK is at a logical low level) and an output of an operational amplifier (opamp) 710 (selected when clock signal CLK is at a logical high level), and an output is selected based on a voltage level of the received control signal, clock signal CLK. The output of the multiplexer 730 is connected to a gate of a PMOSFET 720, whose source is connected to VDD_HIGH and drain connected to both the inverting input terminal of the opamp and the power supply voltage rail VDD_RAIL. In another embodiment, a comparator circuit can be used instead of the opamp. The difference between the two is that the comparator generates an output signal with a logic high or logic low level, that is, logic "one" or logic "zero". In contrast, the output of the opamp can take on a continuous range of analog values between the high voltage rail and ground.

In response to a falling edge of clock signal CLK, the multiplexer 730 selects the input terminal connected to GND and the source of the PMOSFET 720 is connected to GND. The connection of source terminal to GND causes the PMOSFET 720 to turn on and VDD_RAIL connected to the drain terminal of PMOSFET 720 is pulled to VDD_HIGH as a result. By selecting the input terminal connected to GND, the LDO control loop is effectively bypassed. In response to a rising edge of clock signal CLK, the multiplexer 730 selects the output of opamp 710 and couples the output to the source terminal of PMOSFET 720, thereby activating the LDO control loop. The activated LDO control loop forces the PMOSFET 720 to operate as an LDO and because of the opamp 710, the voltage level at the inverting terminal of the opamp 710 (and at VDD_RAIL) is forced to be the same as that of the non-inverting terminal of the opamp 710. That is, VDD_RAIL is set to a level virtually the same as VDD_LOW.

In one embodiment, the voltages VDD_LOW and VDD_HIGH may be generated externally using a buck converter or an LDO within an external voltage regulator module. Alternatively, the voltages may be generated internally using a voltage regulator (e.g., an LDO), which requires a reference voltage and feedback control to generate the control voltage at the gates of the power switches (e.g., PMOSFET 720).

The clock signal CLK is the same clock signal that triggers the launching and receiving timing elements, flip-flops 310, 320, and 330 discussed above in conjunction with FIG. 3. In one embodiment, the phases of the clock signals controlling the multiplexer 730 and triggering the flip-flops 310, 320, and 330 are controlled to match. The phase between the two clock signals is controlled, in one embodiment, by controlling the amount of delay of the clock signal such that the delay between the clock signal's origin at the clock distribution network and the timing elements (i.e., flip-flops 310, 320, and 330) is the same as that of its delay between the clock distribution network and the control of the multiplexer 410. In one embodiment the phase alignment is achieved by deriving the clock signal of the multiplexer from a phase-locked loop (PLL) that generates a clock signal for the clock tree rather than deriving from a branch of the clock tree. Alternatively, a phase matching between the two clock signals is achieved by generating the two clock signals from a same PLL, instead of deriving the clock signals from the clock distribution network. Alternatively, the two clock signals may operate with a phase mismatch of up to 90 degrees, which may be varied by controlling a propagation delay associated with each clock signal.

Figure 8:
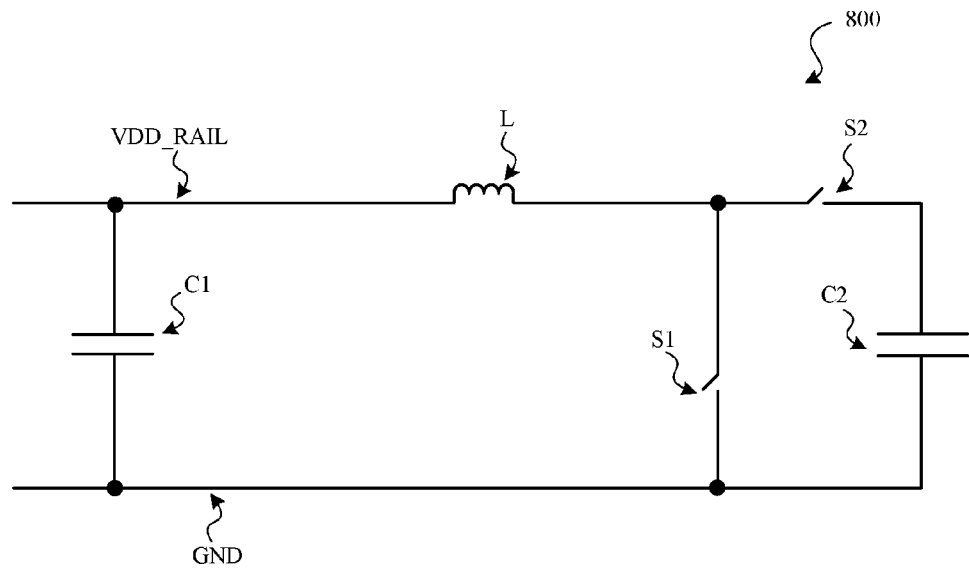
FIG. 8 is a block diagram of an oscillating circuit used for modulating the power supply voltage of the circuit of FIG. 3, according to one embodiment.

FIG. 8 is a block diagram of an oscillating circuit 800 used for modulating the power supply voltage, according to one embodiment. In the embodiment of FIG. 8, the control circuit includes the oscillating circuit 800 that generates oscillation at a frequency controlled by the inductance of the inductor and capacitance of the capacitor. The oscillating circuit 800 produces oscillation between the inductor and the capacitor such that the voltage level at the power supply voltage rail VDD_RAIL increases in one half period of the oscillation period and reduces in the other half, when compared to a nominal voltage of the power supply voltage rail VDD_RAIL (e.g., VDD_NOM). The components of the oscillating circuit 800 are chosen such that the average voltage of the modulated VDD_RAIL (i.e., voltage value averaged over one oscillation period) is equal to VDD_NOM. The oscillation of the oscillating circuit 800 sets VDD_RAIL to a voltage level lower than VDD_NOM in one half period and higher than VDD_NOM in the other half period. In one embodiment, the oscillation frequency is controlled to be same as a frequency of the clock signal CLK.

The oscillating circuit 800 includes an inductor L, two capacitors C1 and C2, and switches S1 and S2. The inductor L may be implemented as either an on-chip inductor or an off-chip inductor. C1 is a power supply decoupling capacitance and C2 is a resonator tank capacitance. The decoupling capacitor C1 exists before adding the oscillating circuit 800 and represents an overall capacitance value of the power supply metal wires (traces), circuits connected to the power supply metal wires as well as any added physical decoupling capacitors. The tank capacitor C2 is added to the oscillating circuit 800 and its value is chosen such that C2 is larger than C1 such that C2 does not limit the amplitude of the oscillation. The two switches S1 and S2 enable the oscillating circuit 800 to sustain the oscillations. The inductor L is connected to the power supply voltage rail VDD_RAIL on one end and to switches S1 and S2 on the other end. The other end of switch S2 is connected to one end of the tank capacitor C2, whose other end is connected to the ground terminal GND. The other end of switch S1 is also connected to the ground terminal GND. The decoupling capacitor C1 is connected between VDD_RAIL and GND. In one embodiment, S1 is implemented as an NMOSFET and S2 is implemented as a PMOSFET.

The oscillating circuit 800 is theoretically self-oscillating but in practice needs energy to be injected into the circuit to compensate for dissipative losses of the inductor L and capacitor C2 (and/or C1) components (e.g., series resistance of inductor L and/or capacitors C1 and C2). In one embodiment, the energy is injected into the oscillating circuit 800 by turning on the switch S1 for a short period of time during one half period of an oscillation cycle. The duration of the S1 turn on time period is small compared to an oscillation period of the oscillating circuit 800. During the turn on time period of S1, current flows from VDD_RAIL to GND through the inductor L and switch S1, and resulting energy is accumulated in the inductor L as current through the inductor L increases with time. The switch S2 is turned off when S1 is turned on to disconnect the tank capacitor C2 from the oscillating circuit 800. When switch S1 is turned off, switch S2 is turned on to couple C2 back in to the oscillating circuit 800 such that the oscillation may proceed. Accordingly, switches S1 and S2 are operated in a complementary fashion such that when one switch is on the other is off, and vice versa.

When switch S2 is turned on and switch S1 is turned off, current flows from VDD_RAIL to GND through the inductor L, the switch S2, and the capacitor C2. This current flow through capacitor C2 results in an increase in the voltage level across the terminals of the capacitor C2 until the energy of the inductor L reaches zero. After the energy of the inductor L reaches zero, the current through the inductor L reverses in direction and the charge is transferred from the capacitor C2 to the power supply rail VDD_RAIL through the inductor L charging the decoupling capacitor C1. The transfer of energy from the tank capacitor C2 to the decoupling capacitor C1 continues until the energy in capacitor C2 reaches zero. After the energy of the capacitor C2 reaches zero, the current through the inductor L reverses back to the direction so that the charge is now transferred from the capacitor C1 to the capacitor C2 through inductor L and switch S2. The transfer of energy between the two capacitors through the inductor L continues as long as pulses of energy are injected into the oscillating circuit 800 in each oscillation cycle.

The inductor L and capacitor C2 components of the oscillating circuit 800 are selected such that a resonant frequency of the oscillating circuit 800 approximately matches the frequency of the clock signal CLK. The resonant frequency may be controlled by varying either the inductance value of inductor L or the capacitance value of capacitors C1 and C2. In one embodiment, the inductor L may be replaced with a bank of different inductor elements connected in parallel, where each inductor element includes an inductor and a series switch. For example, the inductor elements are binary weighted such that three inductor elements with different inductance values will result in eight combinations of effective inductance values. Alternatively or additionally, the tank capacitor C2 (and/or the decoupling capacitor C1) may be replaced with a bank of different capacitor elements connected in parallel, where each capacitor element includes a capacitor and a series switch. An operation of the oscillating circuit 800 showing that an oscillation frequency matches with a frequency of clock signal CLK is shown below in conjunction with FIG. 9.

Figure 9:
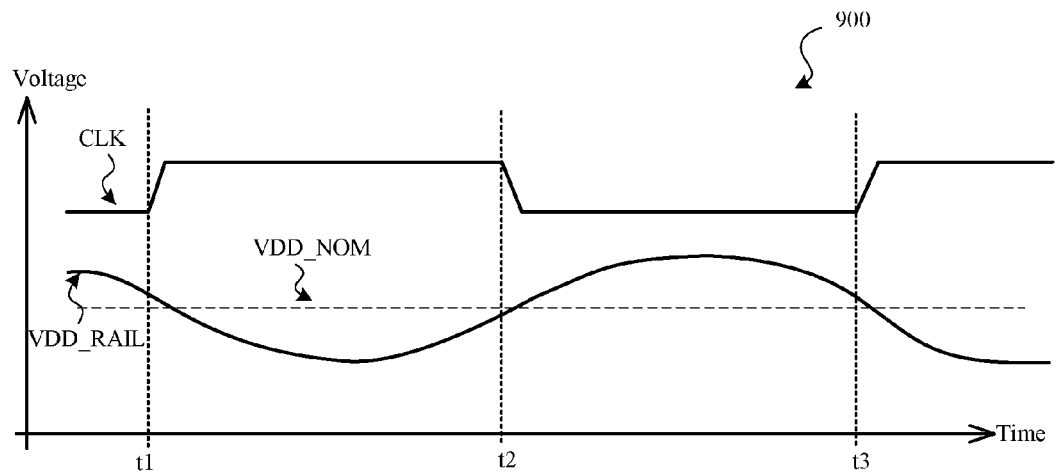
FIG. 9 is a timing diagram illustrating an operation of the oscillating circuit of FIG. 8, according to one embodiment.

FIG. 9 is a timing diagram illustrating an operation of the oscillating circuit 800, according to one embodiment. In FIG. 9, x-axis represents time and y-axis represents the voltage of various signals. Time axis includes various points in time, t1 through t3, represented by vertical dotted lines. FIG. 9 shows clock signal CLK and power supply voltage rail VDD_RAIL along with a nominal value of the power supply voltage VDD_NOM. The time period between points t1 and t3 constitutes one period of clock signal CLK.

At point t1, a rising edge of the clock signal CLK occurs and a first half period of clock signal CLK is between points t1 and t2. During the first half period of clock signal CLK, switch S1 is turned on for a short duration with a pulse (e.g., pulse at node 1124 of FIGS. 11 and 12) to inject energy into the oscillating circuit 800. Due to the oscillation of the oscillating circuit 800 as described above in conjunction with FIG. 8, the power supply voltage of VDD_RAIL oscillates at a frequency equal to that of clock signal CLK with a time period equal to a difference between points t3 and t1. While the frequency between the clock signal CLK and oscillation of the oscillating circuit 800 is the same, there may be a phase difference between the oscillation on VDD_RAIL and that of the clock signal CLK. In one embodiment, the oscillating circuit 800 is tuned such that the oscillation at the supply voltage rail VDD_RAIL is out of phase with respect to the clock signal CLK (e.g., phase difference of about 180 degrees). For example, FIG. 9 shows the voltage signal at VDD_RAIL lagging the clock signal CLK with almost 180 degrees phase difference relative to the clock signal CLK. Alternatively, the oscillating circuit 800 is tuned to set the phase difference to about 90 degrees, where the voltage signal at VDD_RAIL lags the clock signal CLK (i.e., a rising edge at VDD_RAIL lags the rising edge of clock signal CLK by about 90 degrees). The phase difference between the voltage signal at VDD_RAIL and the clock signal CLK may vary from 90 degrees lag to 180 degree lag.

In one embodiment, the desired phase shift between the oscillation of the power rail voltage and the clock signal at the clock pins of the timing elements is achieved by controlling the propagation delay of the signal from the source of the clock distribution tree to the timing elements and from the source of the clock distribution tree to the control circuit that generates pulses for the oscillation circuit 800. To increase the phase lag between the clock and the oscillation of the power rail, delay elements are inserted between the root of the clock distribution tree and the input to the control circuit that generates pules for switches S1 and S2. In another embodiment, the inserted delay element is programmable. The programmable delay is achieved by controllably connecting load capacitors to the outputs of inverters using programmable switches. Another commonly used method for controlling the signal propagation delay is to control the strength of the pull-up and pull-down MOSFETs driving a load on the signal propagation path. In another embodiment, the PLL is used to generating the clock signal for the control of the oscillation circuit 800, rather than deriving the control signal from the clock. The PLL is capable of programmably generating the control with the requested phase shift with respect to clock. The generation of a pulse to turn on switch S1 for sustaining the oscillation of the oscillating circuit 800 is described below in conjunction with FIGS. 10 through 12.

Figures 10, 11, 12:
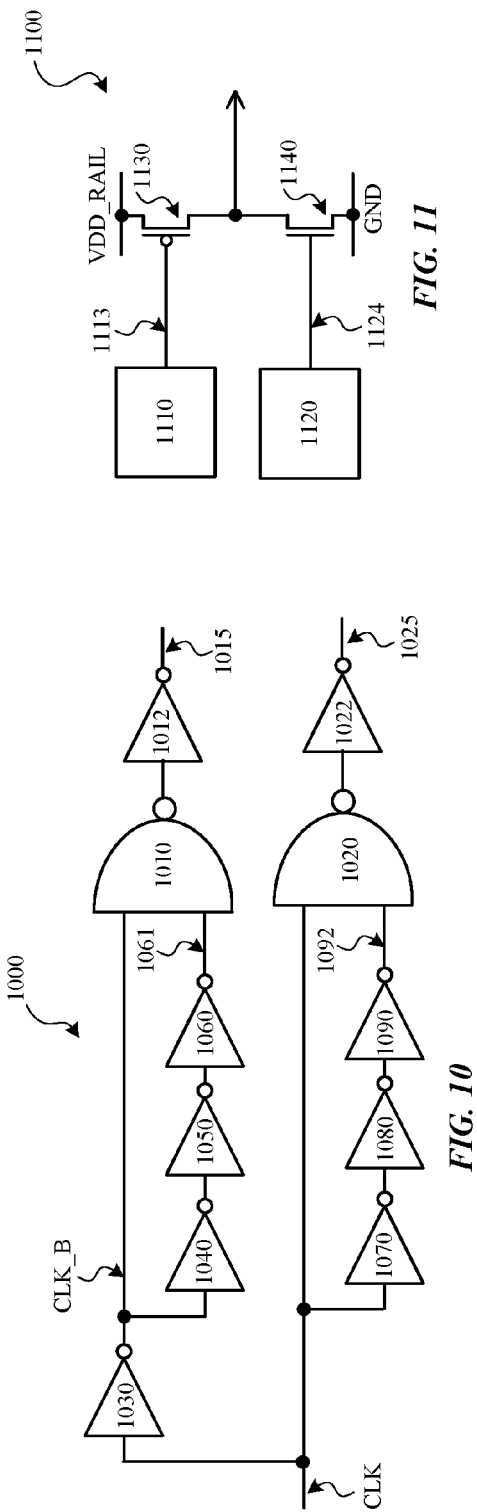
FIG. 10 is a block diagram of a pulse generation circuit for controlling switches of the oscillating circuit of FIG. 8, according to one embodiment.
FIG. 11 is a block diagram of a current injection element used for injecting energy in the oscillating circuit of FIG. 8, according to one embodiment.
FIG. 12 is a timing diagram illustrating an operation of the pulse generation circuit of FIG. 10 and the current injection element of FIG. 11, according to one embodiment.

FIG. 10 is a block diagram of a pulse generation circuit 1000 for controlling switches of the oscillating circuit of FIG. 8, according to one embodiment. The pulse generation circuit 1000 generates pulses when both the inputs of a NAND gate are at a logical high level. The pulse generation circuit 1000 includes two 2-input NAND digital logic gates 1010 and 1020, and two inverters 1012 and 1022. The inputs of the NAND gates 1010 and 1020 are based on the clock signal CLK such that one of the inputs is directly connected to clock signal CLK and the other input is coupled to a delayed version of the clock signal CLK. In one embodiment, the delayed version of the clock signal CLK is generated using an odd number of inverters (e.g., three inverters 1040, 1050, and 1060 shown for NAND 1010 in FIG. 10). When the clock signal CLK is at a constant voltage level (i.e., either at a logical high level or at a logical low level), the two inputs of each NAND gate are out of phase to each other. For example, when clock signal CLK is at a logical high level, the CLK input of NAND 1020 is at a logical high level and the other input 1092 (i.e., the delayed CLK input) is at a logical low level.

In response to an edge transition of the clock signal CLK (i.e., either rising edge or falling edge), one of the NAND gates generates a short pulse. For example, in response to a rising edge of the clock signal CLK, the CLK input of NAND 1020 changes from a logical low level to a logical high level immediately, but the delayed CLK input (i.e., input 1092) transitions from a logical high level (corresponding to a logical low level of clock signal CLK) to a logical low level (corresponding to logical high level of clock signal CLK) only after a duration equal to the propagation delay of the three inverters 1070, 1080, and 1090. For the duration when both the inputs of NAND 1020 are at a logical high level, the output of NAND 1020 is at a logical low level, and the output at node 1025 (i.e., output of inverter 1022) is at a logical high level. Therefore, in response to a rising edge of the clock signal CLK, a pulse at a logical high level is generated at node 1025 with a pulse width equal to the propagation delay of the three inverters 1070, 1080, and 1090. The pulse generated using the NAND gate 1020 is referred to as a pull-down pulse as such a pulse is used with an NMOSFET (e.g., NMOSFET 1140 of FIG. 11) to pull down a voltage level connected to the drain terminal of the NMOSFET.

NAND 1010 in combination with inverter 1012 generates a similar pulse at a logical high level in response to a falling edge of clock signal CLK. The pulse generated using the NAND gate 1010 is referred to as a pull-up pulse as such a pulse is used with a PMOSFET (e.g., PMOSFET 1130 of FIG. 11) to pull up a voltage level connected to the drain terminal of the PMOSFET. The duration of the pull-up and pull-down pulses may be controlled by varying the number of inverters between the two inputs of the NAND gates. While FIG. 10 illustrates the generation of pulses in response to both the rising edge and the falling edge of the clock signal CLK, only one such pulse may be sufficient for injecting energy into the oscillating circuit 800. An example technique for injecting energy into the oscillating circuit 800 is described below in conjunction with FIGS. 11 and 12.

FIG. 11 is a block diagram 1100 of a current injection element used for injecting energy in to the oscillating circuit of FIG. 8, according to one embodiment. The block diagram 1100 includes pulse generation circuits 1110 and 1120, an NMOSFET 1140, and a PMOSFET 1130. For each period of the clock signal CLK, each of the pulse generation circuits 1110 and 1120 generates a pulse of short duration to turn on one of the PMOSFET 1130 and the NMOSFET 1140, for injecting energy into the oscillating circuit 800. In practice, only one of the pulse generation circuits 1110 and 1120, and only one of the NMOSFET 1140 or the PMOSFET 1130 is used for injecting energy. The pulse generation circuit 1110 is the same as the circuit using NAND gate 1010 and the pulse generation circuit 1120 is the same as the circuit using NAND gate 1020 described above in conjunction with FIG. 10.

In one embodiment, NMOSFET 1140 is used to inject energy into the oscillating circuit 800. NMOSFET 1140 functions as the switch S1 of the oscillating circuit 800. In response to a rising edge of the clock signal CLK, the pulse generation circuit 1120 generates a pull-down pulse that turns on NMOSFET 1140 and injects energy into the oscillating circuit 800 for the duration of the pulse. A second pulse that is complementary to the pull-down pulse is generated to control the switch S2. For example, the complementary pulse of S2 is at a logical low level when the pull-down pulse is at a logical high level, and vice versa. Alternatively, PMOSFET 1130 is used to inject energy into the oscillating circuit 800 by controlling a different switch (not shown) of the oscillating circuit 800. When the PMOSFET 1130 is used for injecting energy, the drain terminal of the PMOSFET 1130 is connected to a terminal of the inductor L and the source terminal of the PMOSFET 1130 is connected to VDD_RAIL. An operation of the pulse generation circuits is described below in conjunction with a timing diagram of FIG. 12.

FIG. 12 is a timing diagram illustrating an operation of the pulse generation circuit of FIG. 10 and the current injection element of FIG. 11, according to one embodiment. In FIG. 12, x-axis represents time and y-axis represents voltage of various signals. Time axis includes various points in time, t1 through t8, represented by vertical dotted lines. FIG. 12 shows clock signal CLK, power supply voltage rail VDD_RAIL, and output of pulse generation circuits 1110 and 1120. The time period between points t1 and t5 constitutes one period of clock signal CLK.

At point t1, a falling edge of the clock signal CLK occurs and the output 1113 of the pulse generation circuit 1110 transitions to at a logical high level and generates a pull-up pulse as described above in conjunction with FIG. 11. The output 1113 remains at the logical high level until point t2, where the duration between points t1 and t2 corresponds to the pulse width of the pull-up pulse. The output 1113 remains at a logical low level for the rest of the period of the clock signal CLK. In the subsequent cycle of the clock signal CLK that begins at point t5, the output 1113 transitions again to the logical high level and remains at that level until point t6. Similar to the output 1113, the output 1124 of the pulse generation circuit 1120 transitions to a logical high level at point t3 and generates a pull-down pulse in response to a rising edge of the clock signal CLK, and remains at that level until point t4 for a duration equal to the pulse width of the pull-down pulse. In one embodiment, the point of transition of the clock edge and that of the output of the pulse generation circuits does not match, and there is a delay between the two transitions. Such delay may be controlled by adding delay (e.g., by using an even number of inverters) between the clock signal CLK for the pulse generation and for triggering the timing elements of the circuit (e.g., circuit 400).

Figure 13:
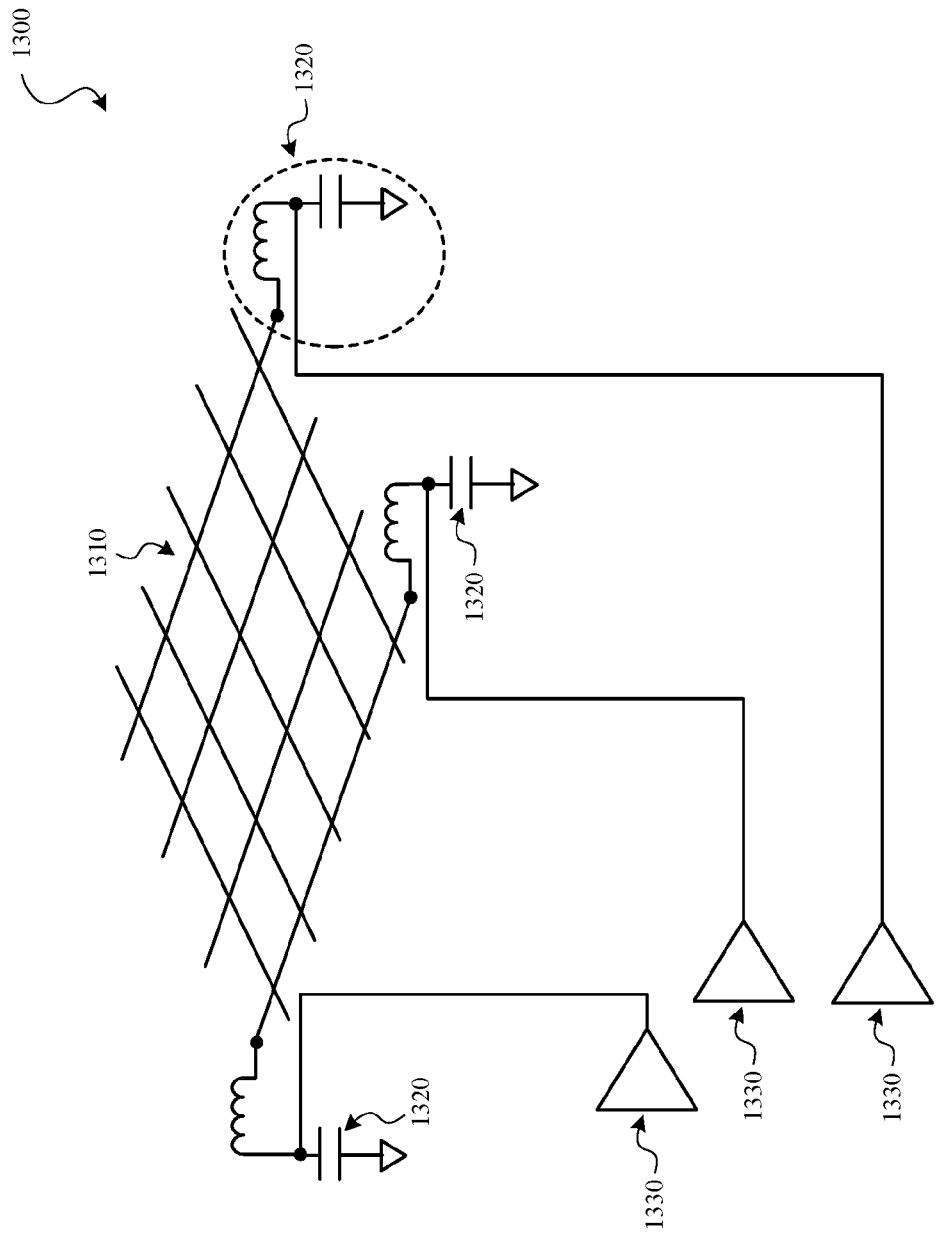
FIG. 13 is a block diagram of a distribution of instances of oscillating circuit of FIG. 8 over a power distribution network of an SOC, according to one embodiment.

FIG. 13 is a block diagram of a distribution of instances of oscillating circuit of FIG. 8 over a power distribution network 1300 of an SOC, according to one embodiment. In FIG. 13, each line of the grid 1310 represents a power supply wire extending over the dimensions of the SOC. Several instances 1320 of the oscillating circuit 800 are placed at various points of the power distribution network 1300 to reduce an amount of loading on any one instance of the oscillating circuit 800. Each instance 1320 may be placed at regular intervals of specified length based on an amount of power consumption expected for a portion of the SOC. For example, each instance is placed between every 200 um of the power supply rails. Each instance 1320 of the oscillating circuit 800 includes the inductor L (or a bank of inductors), the tank capacitor C2, the switches S1 and S2, and the current injection element 1330 (e.g., current injection element 1100). For simplicity, FIG. 13 does not show the switches for each instance 1320. An example process for modulating the power supply voltage is described below in conjunction with FIG. 14.

Figure 14:
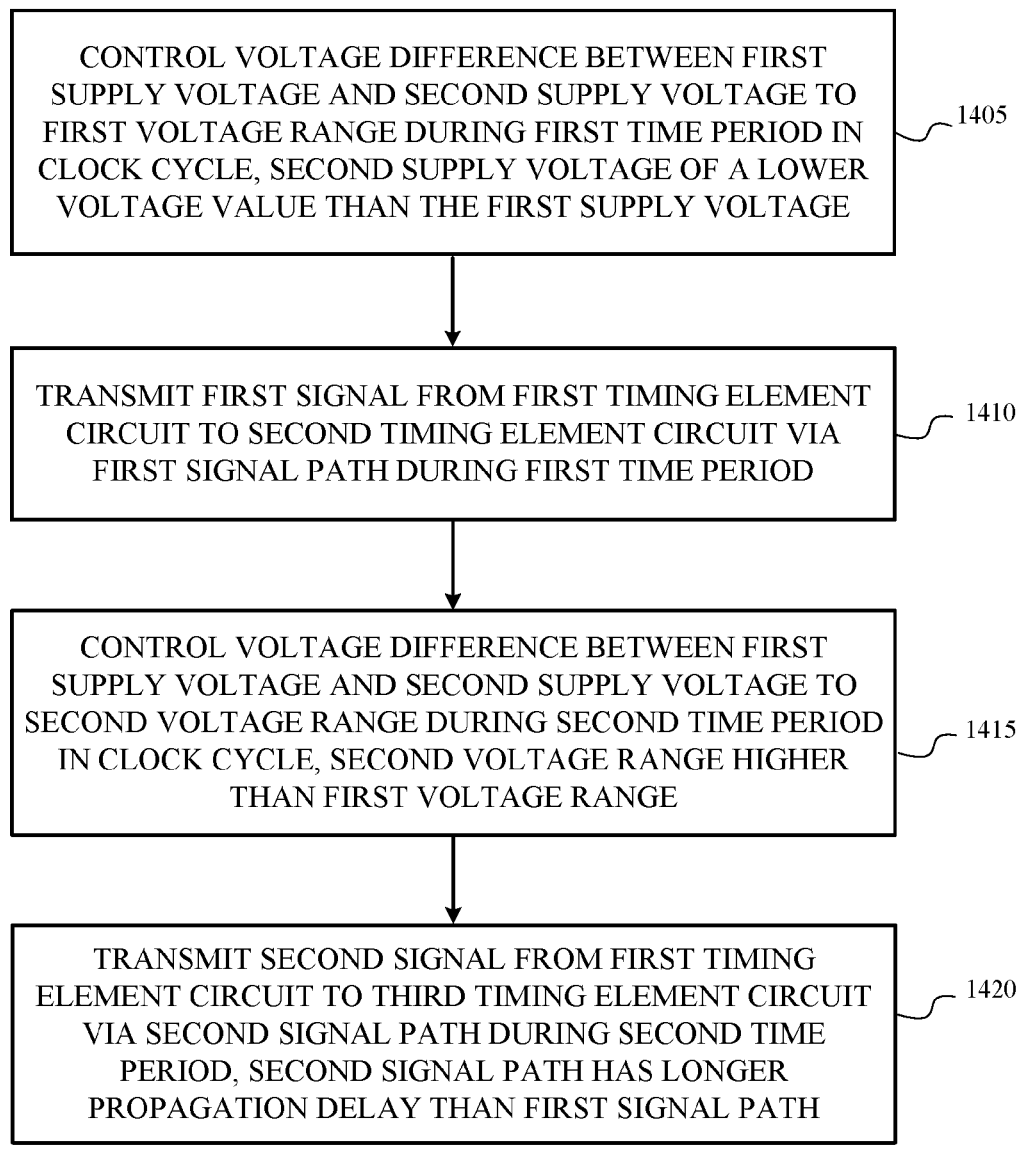
FIG. 14 is a flowchart illustrating modulation of a power supply voltage to vary propagation delay of signal paths in an integrated circuit, according to one embodiment.

FIG. 14 is a flowchart illustrating an example process 1400 for modulating a power supply voltage to control propagation delay of signal paths in an integrated circuit such as an ASIC or SOC, according to one embodiment. Some embodiments may include different and/or additional steps, or perform the steps in different orders.

The integrated circuit includes one or more power supply domains where each power supply domain is powered by a distinct and unique power supply. The power supply voltage for each power supply domain is provided by two power supply rails, a first supply voltage rail (e.g., for supplying voltage corresponding to a logical high level) and a second supply voltage rail (e.g., for supplying voltage corresponding to a logical low level). Each power domain provides power supply voltage to a circuit (e.g., circuit 300 of FIG. 3) including three or more pipeline timing element circuits and two or more logic cells. The circuit includes a first signal path between a first timing element circuit (e.g., flip-flop 310) and a second timing element circuit (e.g., flip-flop 330), and a second signal path between the first timing element circuit and a third timing element circuit (e.g., flip-flop 320), where the second signal path has a longer propagation delay relative to the first signal path. As discussed in conjunction with the circuit 300, the first signal path is an example shorter data path and the second signal path is an example longer data path. The example circuit also includes a control circuit (e.g., multiplexer 410 of FIG. 4 or oscillating circuit 800 of FIG. 8) that performs some of the steps of the example process 1400.

The control circuit controls 1405 a voltage difference between a first supply voltage at the first supply voltage rail and a second supply voltage at the second supply voltage rail to a first voltage range for the circuit during a first time period in a cycle of a clock signal, where the second supply voltage includes a voltage value lower than the first supply voltage. For example, the first supply voltage is VDD and the second supply voltage is GND, where the first supply voltage VDD has a nominal value VDD_NOM. In one embodiment, the first voltage range is a range of voltage values smaller than VDD_NOM. For example, when VDD_NOM is equal to 1.0V, the first voltage range is a range of values around 0.9V but lower than 1.0V. A delta between VDD_NOM and the first voltage range may increase as the value of VDD_NOM increases.

In one embodiment, controlling of the voltage difference between the first supply voltage and the second supply voltage to the first voltage range during the first time period increases a propagation delay along the first signal path and along the second signal path during the first time period to a propagation delay longer than when the voltage difference between the first supply voltage and the second supply voltage remains at a third voltage range that corresponds to an average of the first voltage range and the second voltage range. For example, the average of the first voltage range and the second voltage range is equal to VDD_NOM.

The first timing element circuit transmits 1410 a first signal that propagates from the first timing element circuit to the second timing element circuit via the first signal path during the first time period. In one embodiment, the first time period is one half period of the clock signal from a rising edge to the subsequent falling edge. The first signal may be a data signal that is transmitted from the first timing element circuit in response to a rising edge of the clock signal (i.e., the beginning of the first time period) and reaches the second timing element circuit's data input within the first timing period (i.e., before a falling edge of the clock signal subsequent to the rising edge).

The control circuit controls 1415 the voltage difference between the first supply voltage and the second supply voltage to a second voltage range during a second time period in the cycle of the clock signal, where the second voltage range is higher than the first voltage range. In one embodiment, the second time period is one half period of the clock signal from a falling edge to the subsequent rising edge, and the first time period and the second time period add up to one complete time period of the clock signal.

In one embodiment, controlling of the voltage difference between the first supply voltage and the second supply voltage to the second voltage range during the second time period decreases a propagation delay along the second signal path during the second time period to a propagation delay shorter than when the voltage difference between the first supply voltage and the second supply voltage remains at the third voltage range.

In one embodiment, the second voltage range is a range of voltage values larger than VDD_NOM. For example, when VDD_NOM is equal to 1.0V, the second voltage range is a range of values around 1.1V. Similar to a relationship between VDD_NOM and the first voltage range, a delta between VDD_NOM and the second voltage range may increase as the value of VDD_NOM increases. The magnitude of the delta between VDD_NOM and the first voltage range may be same as the delta between VDD_NOM and the second voltage range. In the above example where VDD_NOM is equal to 1.0V, the magnitude of deltas between the first voltage range and VDD_NOM, and between the second voltage range and VDD_NOM are equal to 0.1V. In embodiments where both the deltas are equal, the increase in the propagation delay along the second signal path during the first time period is virtually the same as the decrease in its propagation delay during the second time period when the duty cycle of the clock signal is about 50%. In other words, when the power supply voltage is modulated to decrease the voltage in the first half clock cycle and increase in the second half cycle by the same amount, the overall propagation delay for the second signal path (i.e., the longer data path) remains virtually the same when compared with a scenario where the power supply voltage is kept constant (e.g., at VDD_NOM) for the entire clock period.

The first timing element circuit transmits 1420 a second signal that propagates from the first timing element circuit to the third timing element circuit via the second signal path during the second time period. The second signal may be a data signal that is transmitted from the first timing element circuit in response to a rising edge of the clock signal (i.e., the beginning of the first time period) and reaches the third timing element circuit's data input within the second time period (i.e., after a falling edge of the clock signal that is subsequent to the rising edge and before a subsequent rising edge). In one embodiment, the second signal is the same data signal as the first signal at its origin (i.e., the first timing element circuit) but is a different signal relative to the first signal by the time it reaches the third timing element circuit due to a different signal path (i.e., the second signal path) traversed by the second signal relative to that of the signal path of the first signal (i.e., the first signal path).

In one embodiment, the control circuit controls the voltage difference to the first voltage range and the second voltage range between the first supply voltage rail and the second supply voltage rail by coupling the first supply voltage rail to a first input or a second input of a multiplexer responsive to a voltage level of the clock signal. The multiplexer (e.g., multiplexer 410) includes a first input connected to a first voltage source of a first voltage level and a second input connected to a second voltage source of a second voltage level lower than the first voltage level. For example, the first voltage level is a logical high level and the second voltage level is a logical low level.

In one embodiment, the multiplexer controls the voltage difference to the first voltage range and the second voltage range by coupling the first supply voltage rail to the first input when the clock signal is at a first level and to couple the first voltage rail to the second input when the clock signal is at a second level lower than the first level, where the first voltage level is a logical high level and the second voltage level is a logical low level. Alternatively, the multiplexer controls the voltage difference to the first voltage range and the second voltage range by coupling the first supply voltage rail to the first input when the clock signal is at the second level and to couple the first voltage rail to the second input when the clock signal is at the first level.

In one embodiment, the control circuit controls the voltage difference to the first voltage range between the first supply voltage rail and the second supply voltage rail by connecting an output of an LDO to either the first supply voltage rail or the second supply voltage rail. The LDO includes an input terminal coupled to the second voltage source and provides an output voltage at the output terminal that is same as the second voltage level as described above in conjunction with FIG. 7.

In one embodiment, the control circuit couples an oscillating circuit (e.g., oscillating circuit 800) between the first supply voltage rail and the second supply voltage rail. The oscillating circuit includes an inductor, a capacitor, and two or more switches, and generates an oscillation at a frequency equal to a frequency of the clock signal as described above in conjunction with FIG. 8. The control circuit controls the voltage difference to the first voltage range between the first supply voltage rail and the second supply voltage rail by generating first current flowing in a direction between the first supply voltage rail to the second supply voltage through the inductor and the capacitor of the oscillating circuit. The control circuit controls the voltage difference to the second voltage range by generating second current flowing between the second supply voltage rail and the first supply voltage through the capacitor and the inductor in a direction opposite to the direction of the first current.

In one embodiment, the power supply voltage modulation may be varied across different power domains of the integrated circuit. For example, the power supply voltage is modulated for some but not all power domains. For the power domains where their power supply voltage is modulated, such modulation may have different delta voltages relative to the nominal power supply voltage between the power domains. For example, one power domain may have a modulation of 100 mV from VDD_NOM whereas another power domain may have a modulation of 200 mV from VDD_NOM. In embodiments that implement the oscillating circuit, the oscillating frequency (and the operating clock frequency for the power domain) may be different across different power domains. For example, one power domain may operate at 1 GHz while another may operate at 2 GHz. The power supply voltage modulation amount (e.g., delta voltages relative to the nominal value) may be varies per power domain depending on a prevalence of hold time violations. For example, as the prevalence of the hold time violations increases, the delta voltage relative to the nominal value may also be increased to reduce the incidence (and sometimes eliminate) of the hold time violations.

Figure 15:
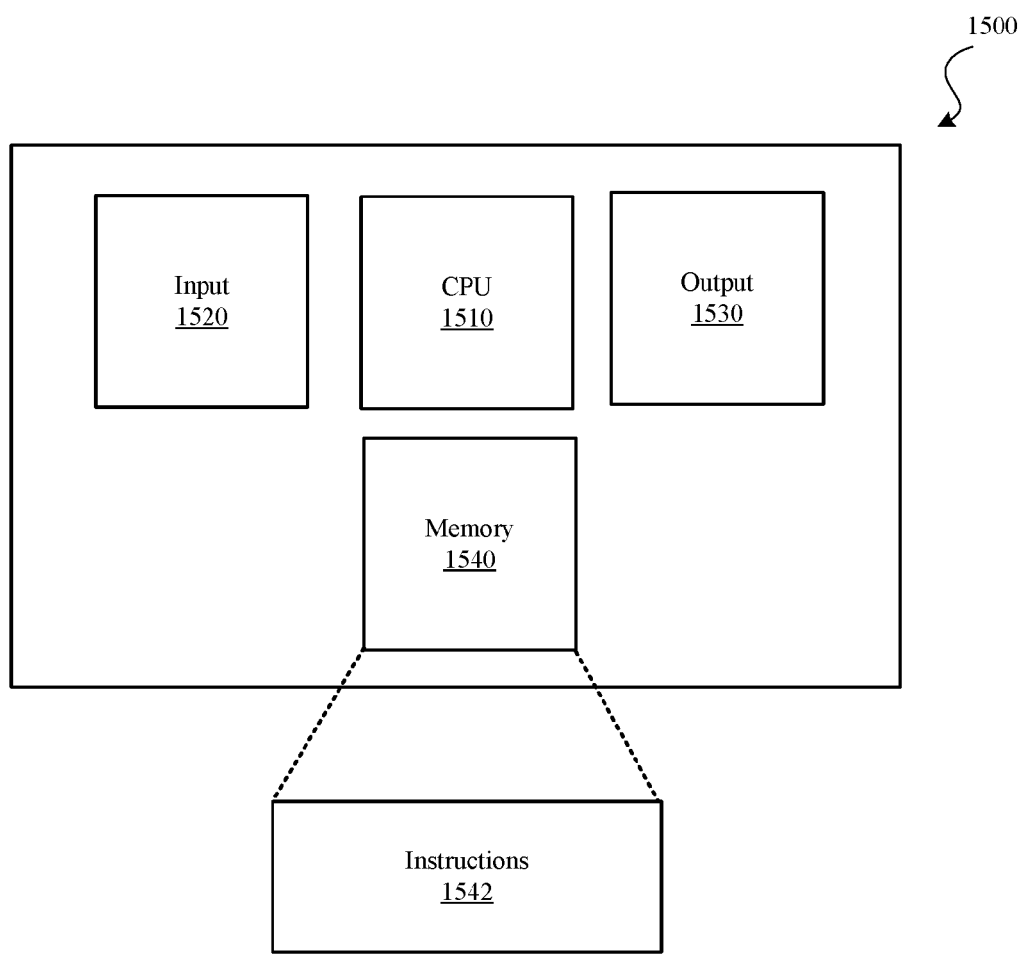
FIG. 15 is a block diagram illustrating an electronic device that stores a digital representation of a control circuit for modulating a power supply voltage to vary propagation delay of signal paths in an integrated circuit, according to one embodiment.

FIG. 15 is a block diagram of a special-purpose computing device 1500 for storing a digital representation of a control circuit (e.g., multiplexer 410 or oscillating circuit 800) or performing design operations associated with the control circuit according to one embodiment. The computing device 1500 may include a CPU 1510, an input 1520, an output 1530, memory 1540 and an interconnect or bus connecting these components.

The digital representation of the control circuit as described above in conjunction with FIGS. 4 through 14 may be stored as data in a non-transitory computer-readable medium (e.g., non-volatile memory within memory 1540). The digital representation may be stored may be at a behavioral level, register transfer level, logic component level, transistor level, and layout geometry-level of a control circuit (e.g., multiplexer 410 or oscillating circuit 800) that modulates the power supply voltage levels.

The computing device 1500 may also store instructions 1542 for performing circuit design operations to include and set parameters for the control circuit in an integrated circuit as described above in conjunction with FIGS. 4 through 14. The instructions 1542 may cause the processor 1510 to perform various operations associated with electronic design automation (EDA) including, but not limited to, synthesis, formal verification, simulation and emulation.

The disclosure herein has been described in particular detail with respect to a few possible embodiments. Those of skill in the art will appreciate that other embodiments may be practiced. First, the particular naming of the components and variables, capitalization of terms, the attributes, data structures, or any other programming or structural aspect is not mandatory or significant, and the mechanisms that implement the invention or its features may have different names, formats, or protocols. Also, the particular division of functionality between the various system components described herein is merely exemplary, and not mandatory; functions performed by a single system component may instead be performed by multiple components, and functions performed by multiple components may instead performed by a single component.

Some portions of above description present features in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times, to refer to these arrangements of operations as modules or by functional names, without loss of generality.

Unless specifically stated otherwise as apparent from the above discussion, it is appreciated that throughout the description, discussions utilizing terms such as "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the embodiments disclosed herein include process steps and instructions described herein in the form of an algorithm. It should be noted that the process steps and instructions could be embodied in software, firmware or hardware, and when embodied in software, could be downloaded to reside on and be operated from different platforms used by real time network operating systems.

The algorithms and operations presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will be apparent to those of skill in the art, along with equivalent variations. In addition, the present invention is not described with reference to any particular programming language. It is appreciated that a variety of programming languages may be used to implement the teachings of the present invention as described herein, and any references to specific languages are provided for invention of enablement and best mode of the present invention.

The embodiments disclosed herein are well suited to a wide variety of computer network systems over numerous topologies. Within this field, the configuration and management of large networks include storage devices and computers that are communicatively coupled to dissimilar computers and storage devices over a network, such as the Internet.

Finally, it should be noted that the language used in the specification has been principally selected for readability and instructional purposes, and may not have been selected to delineate or circumscribe the inventive subject matter. Accordingly, the disclosure herein is intended to be illustrative, but not limiting, of the scope of the invention, which is set forth in the following claims.

What is claimed is:

1. An apparatus comprising:
   a first signal path coupled between a first timing element circuit and a second timing element circuit, the first signal path comprising at least one logic circuit connected to a first supply voltage at a first supply voltage rail and a second supply voltage at a second supply voltage rail;
   a second signal path coupled between the first timing element circuit and a third timing element circuit, the second signal path comprising at least one logic circuit connected to the first supply voltage and the second supply voltage, and the second signal path having a propagation delay longer than a propagation delay of the first signal path; and
   a control circuit coupled to the first supply voltage rail to output the first supply voltage to the first supply voltage rail or output the second supply voltage to the second supply voltage rail, the control circuit configured to:
      control a voltage difference between the first supply voltage and the second supply voltage to a first voltage range during a first time period in a cycle of a clock signal, and
      control the voltage difference between the first supply voltage and the second supply voltage to a second voltage range during a second time period in the cycle of the clock signal, the second voltage range higher than the first voltage range.

2. The apparatus of claim 1, wherein the first time period is equal to the second time period.

3. The apparatus of claim 1, wherein the control circuit comprises a multiplexer having a first input connected to a first voltage source of a first voltage level and a second input connected to a second voltage source of a second voltage level lower than the first voltage level, the multiplexer configured to couple the first supply voltage rail to the first input or the second input responsive to a voltage level of a periodic signal, the periodic signal generated from the clock signal and having the same frequency as the clock signal.

4. The apparatus of claim 3, wherein the multiplexer is further configured to couple the first voltage rail to the first input responsive to the periodic signal being at a first level and to couple the first voltage rail to the second input responsive to the periodic signal being at a second level lower than the first level.

5. The apparatus of claim 3, wherein the multiplexer comprises a first Metal Oxide Semiconductor Field Effect Transistor (MOSFET) and a second MOSFET,
   the first MOSFET comprising:
      a gate terminal coupled to receive the periodic signal,
      a drain terminal coupled to one of the first supply voltage rail and the second supply voltage rail, and
      a source terminal coupled to the first voltage source; and
   the second MOSFET comprising:
      a gate terminal coupled to receive an inverted version of the periodic signal,
      a drain terminal coupled to the one of the first supply voltage rail and the second supply voltage rail, and
      a source terminal coupled to the second voltage source.

6. The apparatus of claim 3, wherein the multiplexer further comprises a low-dropout regulator (LDO) having an input terminal coupled to the second voltage source and an output terminal coupled to at least one of the first supply voltage rail and the second supply voltage rail, an output voltage at the output terminal same as the second voltage level.

7. The apparatus of claim 1, wherein the control circuit comprises an oscillating circuit coupled between the first supply voltage rail and the second supply voltage rail, the oscillating circuit comprising an inductor and a capacitor to resonate at a frequency of the clock signal.

8. The apparatus of claim 7, wherein the oscillating circuit is configured to resonate at the frequency of the clock signal by adjusting inductance of the inductor.

9. The apparatus of claim 7, wherein the oscillating circuit further comprises a switch coupled between the inductor and the second supply voltage rail to turn on for a third time period, the third time period smaller than a time period of a resonance of the oscillating circuit.

10. The apparatus of claim 9, wherein the switch is configured to turn on by either a pull-down pulse or a pull-up pulse, the pull-down pulse used when the switch is an N-type Metal Oxide Semiconductor Field Effect Transistor based switch and pull-up pulse used when the switch is a P-type Metal Oxide Semiconductor Field Effect Transistor based switch.

11. The apparatus of claim 7, wherein the inductor comprises a plurality of inductor elements connected in parallel, each inductor element comprises an inductor and a switch, the switch connected in series with the inductor of the inductor element.

12. The apparatus of claim 7, wherein the control circuit comprises a plurality of oscillating circuits spatially distributed over a supply voltage distribution network, the supply voltage distribution network associated with either the first supply voltage rail or the second supply voltage rail.

13. The apparatus of claim 1, wherein the control circuit is further configured to control the voltage difference by decreasing or increasing the first supply voltage and maintaining the second supply voltage.

14. A method comprising:
controlling, to a first voltage range, a voltage difference between a first supply voltage at a first supply voltage rail connected to logic circuits and a second supply voltage at a second supply voltage rail connected to the logic circuits during a first time period in a cycle of a clock signal, the second supply voltage of a lower voltage value than the first supply voltage;
transmitting a first signal from a first timing element circuit to a second timing element circuit via a first signal path during the first time period, the first signal path extending between the first timing element circuit and the second timing element circuit;
controlling, to the second voltage range, the voltage difference between the first supply voltage at the first supply voltage rail connected to the logic circuits and the second supply voltage at the second supply voltage rail connected to the logic circuits during a second time period in the cycle of the clock signal, the second voltage range higher than the first voltage range; and
transmitting a second signal from the first timing element circuit to a third timing element circuit via a second signal path during the second time period, the second signal path extending between the first timing element circuit and the third timing element circuit, the second signal path having a propagation delay longer than a propagation delay of the first signal path.

15. The method of claim 14, wherein controlling the voltage difference to the first voltage range comprises decreasing the first supply voltage and maintaining the second supply voltage, and wherein controlling the voltage difference to the second voltage range comprises increasing the first supply voltage and maintaining the second supply voltage.

16. The method of claim 14, wherein controlling the voltage difference to the first voltage range comprises coupling the first supply voltage rail to a first input of a multiplexer at a first voltage level, and wherein controlling the voltage difference to the second voltage range comprises coupling the first supply voltage rail to a second input of the multiplexer at a second voltage level lower than the first voltage level.

17. The method of claim 16, wherein the multiplexer couples the first supply voltage rail to the first input responsive to a periodic signal being at a first level and the multiplexer couples the first voltage rail to the second input responsive to the periodic signal being at a second level lower than the first level, the periodic signal generated from the clock signal and having the same frequency as the clock signal.

18. The method of claim 16, wherein controlling the voltage difference to the first voltage range further comprises transmitting an output voltage of a low-dropout regulator (LDO) to the first supply voltage rail, an input terminal of the LDO coupled to a voltage source of the first voltage range and an output terminal of the LDO connected to the first supply voltage rail.

19. The method of claim 14, wherein controlling the voltage difference to the first voltage range comprises generating first current flowing in a first direction between the first supply voltage rail and the second supply voltage rail through an inductor and a capacitor of an oscillating circuit that generates oscillation at a frequency equal to a frequency of the clock signal between the first supply voltage rail and the second supply voltage rail, and wherein controlling the voltage difference to the second voltage range comprises generating second current flowing between the first supply voltage rail and the second supply voltage rail through the inductor and the capacitor in a second direction opposite to the first direction.

20. A non-transitory computer-readable medium storing a representation of an apparatus, the apparatus comprising:
a first signal path coupled between a first timing element circuit and a second timing element circuit, the first signal path comprising at least one logic circuit connected to a first supply voltage at a first supply voltage rail and a second supply voltage at a second supply voltage rail;
a second signal path coupled between the first timing element circuit and a third timing element circuit, the second signal path comprising at least one logic circuit connected to the first supply voltage and the second supply voltage, and the second signal path having a propagation delay longer than a propagation delay of the first signal path; and
a control circuit coupled to the first supply voltage rail to output the first supply voltage to the first supply voltage rail or output the second supply voltage to the second supply voltage rail, the control circuit configured to:
control a voltage difference between the first supply voltage and the second supply voltage to a first voltage range during a first time period in a cycle of a clock signal, and
control the voltage difference between the first supply voltage and the second supply voltage to a second voltage range during a second time period in the cycle of the clock signal, the second voltage range higher than the first voltage range.

* * * * *